(12) United States Patent
Nakano et al.

(10) Patent No.: US 11,114,225 B2
(45) Date of Patent: Sep. 7, 2021

(54) RARE EARTH THIN FILM MAGNET AND PRODUCTION METHOD THEREOF

(71) Applicant: JX Nippon Mining & Metals Corporation, Tokyo (JP)

(72) Inventors: Masaki Nakano, Nagasaki (JP); Hirotoshi Fukunaga, Nagasaki (JP); Takeshi Yanai, Nagasaki (JP); Hironobu Sawatari, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 558 days.

(21) Appl. No.: 16/077,961

(22) PCT Filed: Feb. 28, 2017

(86) PCT No.: PCT/JP2017/007635
§ 371 (c)(1),
(2) Date: Aug. 14, 2018

(87) PCT Pub. No.: WO2017/154653
PCT Pub. Date: Sep. 14, 2017

(65) Prior Publication Data
US 2020/0111590 A1 Apr. 9, 2020

(30) Foreign Application Priority Data
Mar. 7, 2016 (JP) .............................. JP2016-043193

(51) Int. Cl.
*H01F 1/057* (2006.01)
*H01F 10/14* (2006.01)
*H01F 41/14* (2006.01)

(52) U.S. Cl.
CPC ............. *H01F 1/057* (2013.01); *H01F 10/14* (2013.01); *H01F 41/14* (2013.01)

(58) Field of Classification Search
CPC .......... H01F 1/057; H01F 10/14; H01F 41/14
See application file for complete search history.

(56) References Cited

U.S. PATENT DOCUMENTS 7,790,300 B2   9/2010   Suzuki et al.
9,972,428 B2   5/2018   Shindo
(Continued)

FOREIGN PATENT DOCUMENTS

JP   2003-303708 A    10/2003
JP   2004134416 A  *   4/2004  ........... H01F 10/126
(Continued)

OTHER PUBLICATIONS

Nakano, M., et al. "Nd—Fe—B Film Magnets With Thickness Above 100 μm Deposited on Si Substrates." IEEE Transactions on Magnetics, vol. 51, No. 11, 2015, pp. 1-4 (Year: 2015).*
(Continued)

*Primary Examiner* — Paul A Wartalowicz
*Assistant Examiner* — Ryan L Heckman
(74) *Attorney, Agent, or Firm* — Howson & Howson LLP

(57) ABSTRACT

A rare-earth thin film magnet is provided which includes Nd, Fe and B as essential components, characterized by including a Si substrate having an oxide film present on a surface thereof, a Nd base film formed as a first layer over the Si substrate, and a Nd—Fe—B film formed as a second layer on the first layer. The rare earth thin film magnet and a production process therefor provides a rare earth thin film magnet suffering neither film separation nor substrate breakage and having satisfactory magnetic properties even when the second layer has composition in the range of 0.120 ≤Nd/(Nd+Fe)<0.150, which corresponds to a compositional range in the vicinity of a stoichiometric composition.

12 Claims, 2 Drawing Sheets

(56) References Cited

U.S. PATENT DOCUMENTS

| | | | |
|---|---|---|---|
| 2004/0091745 A1* | 5/2004 | Yamashita | B82Y 40/00 |
| | | | 428/811.3 |
| 2015/0008998 A1 | 1/2015 | Kishimoto et al. | |
| 2015/0017053 A1 | 1/2015 | Shindo | |
| 2015/0047469 A1 | 2/2015 | Hino et al. | |
| 2015/0262752 A1 | 9/2015 | Sawatari | |
| 2016/0343482 A1 | 11/2016 | Nakano et al. | |
| 2017/0356081 A1* | 12/2017 | Nakano | C23C 14/28 |
| 2019/0062880 A1* | 2/2019 | Nakano | C23C 14/28 |

FOREIGN PATENT DOCUMENTS

| | | | | |
|---|---|---|---|---|
| JP | 2007-088101 A | | 4/2007 | |
| JP | 2009-091613 A | | 4/2009 | |
| JP | 2009091613 A | * | 4/2009 | H01F 10/265 |
| JP | 4988713 B2 | * | 8/2012 | H01F 10/126 |
| JP | 2012-207274 A | | 10/2012 | |
| JP | 2012207274 A | * | 10/2012 | H01F 10/265 |
| JP | 2012-235003 A | | 11/2012 | |
| WO | 2014/038022 A1 | | 3/2014 | |
| WO | WO-2014038022 A1 | * | 3/2014 | H01F 10/265 |
| WO | WO-2015186389 A1 | * | 12/2015 | C22C 33/003 |
| WO | WO-2016104117 A1 | * | 6/2016 | C23C 14/06 |

OTHER PUBLICATIONS

Fukunaga, H., et al. "Effect of Laser Beam Parameters on Magnetic Properties of Nd—Fe—B Thick-Film Magnets Fabricated by Pulsed Laser Deposition." Journal of Applied Physics, vol. 109, No. 7, 2011 (Year: 2011).*
Machine Translation of WO-2015186389-A1 (Year: 2015).*
Machine Translation of JP-2012207274-A (Year: 2012).*
Machine Translation of JP-2009091613-A (Year: 2009).*
Machine Translation of WO-2014038022-A1 (Year: 2014).*
Machine Translation of WO-2016104117-A1 (Year: 2016).*
Machine Translation of JP-4988713-B2 (Year: 2012).*
Machine Translation of JP-2004134416-A (Year: 2004).*
H. Fukunaga et al., "Effect of Laser Beam Parameters on Magnetic Properties of Nd—Fe—B Thick-Film Magnets Fabricated by Pulsed Laser Deposition", Journal of Applied Physics, vol. 109, Issue 7, pp. 07A758-1-07A7583, Apr. 2011.
N.M. Dempsey et al., "High Performance Hard Magnetic NdFeB Thick Films for Integration into Micro-Electro-Mechanical-Systems", Applied Physics Letters, vol. 90, pp. 092509-1-092509-3, 2007 (month unknown).
H. Fukunaga et al., "Magnetic Properties of Nd—Fe—B/a-Fe Multi-Layered Thick-Film Magnets", Journal of Physics: Conference Series, vol. 266, pp. 012027-1-012027-5, 2011 (month unknown).
G. Reiger et al., "Nd—Fe—B Permanent Magnets (Thick Films) Produced by a Vacuum-Plasma-Spraying Process", Journal of Applied Physics, vol. 87, pp. 5329-5331, 2000 (month unknown) (Abstract Only).
M. Nakano et al., "Review of Fabrication and Characterization of Nd—Fe—B Thick Films for Magnetic Micromachines", IEEE Transactions on Magnets, vol. 43, Issue 6, pp. 2672-2676, Jun. 2007 (Abstract Only).
M. Ishizone et al., "Magnetic Properties and Crystallite Orientation in Nd2Fe14B-a-Fe Nanocomposite Thin Films", The Magnetics Society of Japan Journal, vol. 24, No. 4-2, pp. 423-426, Jan. 2000.
S Sato, "Nano Kessho Kozo o Motsu Nanshitsu Oyobi Koshitsu Jisei Zairyo ni Okeru Hojiryoku Kiko no Kaiseki", University of Tsukuba Daigakuin Hakushi Katei Suri Busshitsu Kagaku Kenkyuka Hakushi Ronbun, University of Tsukuba Daigakuin, pp. 91 to 98, Feb. 2012 (English Summary provided).
N. Adachi et al., "Synthesys of the Rare Earth Magnetic Film for Microactuators", Ceramics Research Laboratory, Nagoya Institute of Technology, vol. 6, pp. 46-50, 2006 (month unknown) (English Abstract provided).
M. Nakano et al., "Nd—Fe—B Film Magnets With Thickness Above 100 μm Deposited on Si Substrates", IEEE Transactions on Magnetics, vol. 51, Issue 11, Nov. 2015 (English Abstract Only).
M. Nakano et al., "Preparation and Magnetic Properties of Thick Film Magnets", Journal of the Japan Institute of Metals, vol. 76, No. 1, pp. 59-64, Jan. 2012.
Mhan-Joong Kim et al., "Magnetic Properties of NdFeB Thin Film Obtained by Diffusion Annealing", IEEE Transactions on Magnetics, vol. 36, No. 5, pp. 3370-3372, Sep. 2000.
Yu Chikuma et al., "Thick Film Thickness of Nd—Fe—B Based Magnet Film Deposited on Si Substrate", Kyushu Section, IEICE Rengo Taikai Koen Ronbunshu, vol. 2014, Kyushu Section, IEICE Rengokai, p. 434, Feb. 2016.
N. Adachi et al., "Synthesys of the Rare Earth Magnetic Film for Microactuators", Annual Report of the Ceramics Research Laboratory, Nagoya Institute of Technology, vol. 6, pp. 46-50, 2007 (month unknown) (Full English Language Translation provided).
M. Oryoshi et al., "Isotropic Nd—Fe—B Thick Film Magnets Deposited on Si Substrates", Technical Meeting on Magnetics of IEE Japan, MAG-13-075, pp. 37-41, Aug. 2013 (Full English Language Translation provided).

* cited by examiner

RARE EARTH THIN FILM MAGNET AND PRODUCTION METHOD THEREOF

BACKGROUND

The embodiment of the present invention relates to a rare earth thin film magnet produced from a Nd—Fe—B film formed on a silicon substrate and to a method of producing a Nd—Fe—B film rare earth thin film magnet formed via the pulsed laser deposition (PLD) method.

In recent years, pursuant to the miniaturization and weight-saving of electronic devices, the miniaturization and improved performance of rare earth magnets having superior magnetic properties are being advanced. Among the above, because a neodymium-iron-boron (Nd—Fe—B)-based magnet has the highest maximum energy product among existing magnets, its application in MEMS (Micro Electro Mechanical Systems), in the energy sector such as energy burst (energy harvesting) as well as in the field of medical appliances is anticipated.

It is known that this kind of rare earth magnetic thin film is generally produced via the sputtering method (Patent Document 1, Non-Patent Document 1), the pulsed laser deposition (PLD) method (Patent Document 2, Non-Patent Document 2), or other physical vapor deposition (PVD) methods (Non-Patent Document 3). Furthermore, all of these documents form a rare earth magnetic thin film on a metal substrate made from tantalum, molybdenum or other metals.

Meanwhile, when preparing micro actuators of micro magnetic devices for MEMS (Micro Electro Mechanical Systems), there are strong demands for stably forming a Nd—Fe—B film, i.e. rare earth magnetic thin film on a versatile Si substrate in order to effectively utilize the lithographic technique based on a silicon (Si) semiconductor.

Non-Patent Document 4 describes that, when a magnetic film having the same composition as $Nd_2Fe_{14}B$, which is a stoichiometric composition, is directly deposited on a Si substrate, stress is generated due to the linear expansion coefficient difference between the Si substrate and the Nd—Fe—B film during the heat treatment process of deposition, and the magnetic film becomes separated. Non-Patent Document 4 also describes forming a $MoSi_2$ stress buffer film having a thickness of 50 nm on the Si substrate as a solution for alleviating the stress during heat treatment, and that it was consequently possible to form a Nd—Fe—B film having a thickness of 2 μm without any separation.

Nevertheless, when the film thickness is thin at only several μm, the magnetic field that is generated from the plane of the film in the vertical direction decreases because it is affected by the diamagnetic field, and, while the magnetic field generated in the cross section direction of the film is not affected by the diamagnetic field, it becomes difficult to supply a magnetic field to a sufficient area because the volume of the magnetic thin film is small. In order to generate a sufficient magnetic field outside the film, a film thickness of at least 10 μm or more is required. Meanwhile, when there is a difference in the linear expansion coefficient between the substrate and the film, because stress applied on the interface of the film and the substrate will increase as the film thickness increases, film separation becomes more likely. Thus, a stress buffer film material which is free from film separation even when a thick Nd—Fe—B film is deposited on the Si substrate has been awaited for a long time.

Non-Patent Document 5 describes that it was possible to deposit a Nd—Fe—B film without any separation up to a film thickness of 20 μm by interposing a Ta film, which has an intermediate value of the linear expansion coefficient between Si and $Nd_2Fe_{14}B$, on a Si substrate by using the pulsed laser deposition method. Nevertheless, when forming a film having a film thickness exceeding 20 μm, there were problems in that film separation would occur between the Nd—Fe—B film and the Ta film, and breakage would occur within the Si substrate.

Prior Art Documents

[Patent Document 1] JP 2012-207274 A
[Patent Document 2] JP 2009-091613 A
[Patent Document 3] Japanese Patent Application No. 2014-218378
[Non-Patent Document 1] N. M. Dempsey, A. Walther, F. May, D. Givord, K. Khlopkov, O. Gutfeisch: Appl. Phys. Lett. Vol. 90 (2007) 092509-1-092509-3.
[Non-Patent Document 2] H. Fukunaga, T. Kamikawatoko, M. Nakano, T. Yanai, F. Yamashita: J. Appl. Phys. Vol. 109 (2011) 07A758-1-07A758-3.
[Non-Patent Document 3] G. Rieger, J. Wecker, W. Rodewalt, W. Scatter, Fe.-W. Bach, T. Duda and W. Unterberg: J. Appl. Phys. Vol. 87 (2000) 5329-5331.
[Non-Patent Document 4] Adachi, Isa, Ita, Okuda: Annual Report of Ceramics Research Laboratory Vol. 6 (2006) 46-50.
[Non-Patent Document 5] Oryoji, Nakano, Yanai, Fukunaga, Fujii: The Institute of Electrical Engineers of Japan, Magnetics Society Materials, MAG-13-075 (2013).

SUMMARY

Previously, the present inventors conducted research on methods for inhibiting the separation of the Nd—Fe—B film and the Si substrate and the breakage that occurs within the Si substrate. Consequently, the present inventors focused on the point that the linear expansion coefficient of Nd lies midway between the linear expansion coefficient of $Nd_2Fe_{14}B$ and the linear expansion coefficient of Ta, and, by directly depositing a Nd—Fe—B film, in which the Nd content is greater than that of a stoichiometric composition, on a silicon substrate, discovered that the "Nd-rich phase existing at the interface of the Si substrate and the Nd—Fe—B film" is able to reduce the difference between the respective linear expansion coefficients and prevent film separation and substrate breakage (Patent Document 3).

According to this method, via the pulsed laser deposition method, it is possible to inhibit film separation and substrate breakage and increase the thickness of the film up to around 160 μm, by depositing a Nd—Fe—B film having a composition in which the Nd content is greater than that of a stoichiometric composition, i.e. a Nd—Fe—B film which satisfies $0.150 \leq Nd/(Nd+Fe)$, on a silicon substrate with a thermal oxide film formed thereon. Nevertheless, there was a problem in that while the coercive force increases as the Nd content increases on one hand, the residual magnetization and $(BH)_{max}$ would decrease on the other hand.

The embodiment of the present invention was devised in order to resolve the foregoing problems, and an object of this invention is to provide a rare earth thin film magnet of a Nd—Fe—B film deposited on a Si substrate which exhibits favorable magnetic properties and which is less susceptible to the occurrence of film separation and substrate breakage even in a compositional range of $0.120~5 \leq Nd/(Nd+Fe)$ <0.150, which corresponds to a compositional range in the vicinity of a stoichiometric composition, as well as provide a method of producing such a rare earth thin film magnet capable of stably depositing the foregoing thin film.

In order to resolve the foregoing problems, as a result of intense study regarding the structure of the interface between the Si substrate and the Nd—Fe—B film, the present inventors discovered that, by forming a Nd base film (buffer layer) on a Si substrate in which the surface thereof was subject to thermal oxidation, it is possible to stably form a film without any separation and substrate breakage even when a Nd—Fe—B film (functional layer), in which its composition satisfies 0.120≤Nd/(Nd+Fe)<0.150, is formed on the foregoing Nd base film (function layer).

Based on the findings, the present inventors provide the following solutions:

1) A rare earth thin film magnet having Nd, Fe and B as essential components, which includes, a Nd base film as a first layer on a Si substrate having an oxide film on a surface thereof, and a Nd—Fe—B film as a second layer on the first layer.

2) The rare earth thin film magnet according to 1) above, wherein a composition (atomic ratio) of Nd—Fe—B of the second layer satisfies a conditional expression of 0.120≤Nd/(Nd+Fe)<0.150.

3) The rare earth thin film magnet according to 1) or 2) above, wherein a film thickness of the first layer is 0.2 μm or more and 5.0 μm or less.

4) The rare earth thin film magnet according to any one of 1) to 3) above, wherein a film thickness of the second layer is 5 μm or more and 50 μm or less.

5) The rare earth thin film magnet according to any one of 1) to 4) above, wherein the oxide film is a thermal oxide film.

6) The rare earth thin film magnet according to any one of 1) to 5) above, wherein the rare earth thin film magnet comprises a layer formed from Fe—Si—O between the Si substrate and the Nd base film.

7) The rare earth thin film magnet according to any one of 1) to 6) above, wherein the rare earth thin film magnet has a residual magnetization of 0.55 T or more.

8) The rare earth thin film magnet according to any one of 1) to 7) above, wherein the rare earth thin film magnet has a coercive force of 210 kA/m or more.

9) The rare earth thin film magnet according to any one of 1) to 8) above, wherein the rare earth thin film magnet has a maximum energy product $(BH)_{max}$ of 36 kJ/m$^3$ or more.

10) A method of producing a rare earth thin film magnet, wherein an oxide film is formed on a Si substrate, a Nd base film as a first layer is formed on the Si substrate via laser pulsed deposition, a Nd—Fe—B film as a second layer is subsequently formed thereon, and heat treatment is thereafter performed thereto.

11) The method of producing a rare earth thin film magnet according to 10) above, wherein the heat treatment is performed at a temperature of 500° C. or higher and 800° C. or less.

The embodiment of the present invention yields a superior effect of being able to produce a rare earth thin film magnet which exhibits favorable magnetic properties and which is less susceptible to film separation and substrate breakage, even when the deposited film is a thick film, by forming a Nd film as a base film (buffer layer) on a Si substrate having an oxidized surface, depositing a Nd—Fe—B film having a composition (atomic ratio) which satisfies 0.120 5≤Nd/(Nd+Fe)<0.150 on the foregoing Nd film, and thereafter performing heat treatment to the Nd—Fe—B film.

DETAILED DESCRIPTION

Figure 1:
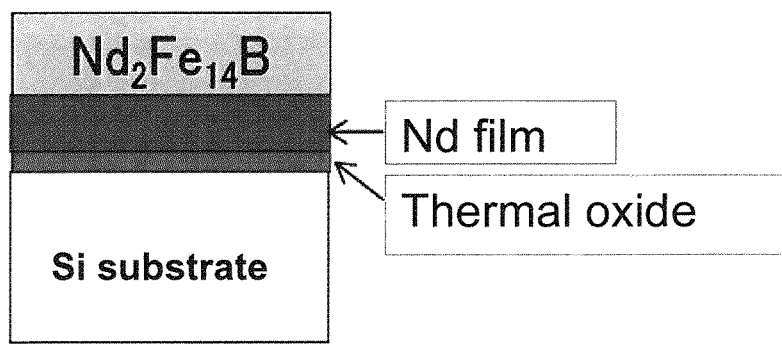
FIG. 1 is a schematic cross section showing an example of the Nd—Fe—B rare earth thin film magnet of the embodiment of the present invention.

The embodiment of the present invention is a rare earth thin film magnet having Nd, Fe and B as essential components, wherein the rare earth thin film magnet includes, as a first layer, a Nd base film (buffer layer) on a Si substrate having an oxide film on a surface thereof, and, as a second layer, a Nd—Fe—B film (functional layer) on the first layer. As a result of comprising a Nd base film, the rare earth thin film magnet of the embodiment of the present invention is able to alleviate the linear expansion coefficient difference between the Si substrate and the Nd—Fe—B film, and exhibit a superior effect of being able to inhibit film separation and substrate breakage.

In the rare earth thin film magnet of the embodiment of the present invention, the Nd—Fe—B film as the second layer preferably has a composition (atomic ratio) which satisfies 0.120≤Nd/(Nd+Fe)<0.150, which corresponds to a compositional range in the vicinity of a stoichiometric composition. When the composition deviates considerably from the stoichiometric composition ($Nd_2Fe_{14}B_1$), it becomes difficult to obtain the intended magnetic properties. Moreover, when a Nd-rich composition exceeding the foregoing range is adopted to form the Nd buffer layer as with conventional methods, while the coercive force may increase, there are cases where the saturation magnetization (residual magnetization) may decrease.

Moreover, with the rare earth thin film magnet of the embodiment of the present invention, the film thickness of the Nd base film (buffer layer) is preferably 0.2 μm or more and 5.0 μm or less. When the film thickness of the Nd base film is less than 0.2 μm, the Nd film is unable to uniformly cover the entire surface of the Si substrate, and the effect of inhibiting film separation may deteriorate. Meanwhile, when the film thickness of the Nd base film exceeds 5.0 μm, the adhesion will deteriorate, which is undesirable. The reason why the adhesion deteriorates is considered to be because the diffusion of Fe from the Nd—Fe—B layer to the Si substrate becomes insufficient, and the formation of the Fe—Si—O layer, which is adhesive, between the Si substrate and the Nd layer becomes difficult. Note that, upon forming the Nd base film, a part of Nd may become naturally oxidized, but the embodiment of the present invention also covers such a case.

In the rare earth thin film magnet of the embodiment of the present invention, the film thickness of the Nd—Fe—B film (functional layer) is preferably 5 μm or more and 50 μm or less. When the film thickness of the Nd—Fe—B film is less than 5 μm, there are cases where sufficient magnetic properties cannot be obtained. On the other hand, when the film thickness of the Nd—Fe—B film exceeds 50 μm, even when a Nd base film is provided, there are cases where film separation and substrate breakage cannot be fully inhibited in terms of mechanical strength because the ratio of thickness of the Nd—Fe—B film relative to the thickness of the adhesion layer formed from Fe—Si—O becomes excessive. By way of reference, when a Nd—Fe—B film having a composition in the vicinity of the stoichiometric composition is deposited with a Nd base layer, the maximum film thickness that can be obtained without breakage is roughly 10 μm, but it is notable that the embodiment of the present invention is able to achieve a thick film of up to roughly 50 μm even with a rare earth thin film magnet having a compositional range in the vicinity of the stoichiometric composition.

Note that, with regard to the Nd—Fe—B film which is formed, via the Nd base film, on the Si substrate having an oxide film formed thereon, a part of the Fe existing in the Nd—Fe—B film becomes diffused to the Nd base film due to the heat treatment that is performed for crystallization, and, as a result of the additional reaction between Si and O as the oxide film on the Si substrate surface, there are cases where a layer having a thickness of several ten nm composed of Fe—Si—O is formed. As described above, this Fe—Si—O film is considered to be contributing to the improvement in adhesion. The embodiment of the present invention also tolerates the existence of such a layer that is formed during the production process thereof.

Figure 5:
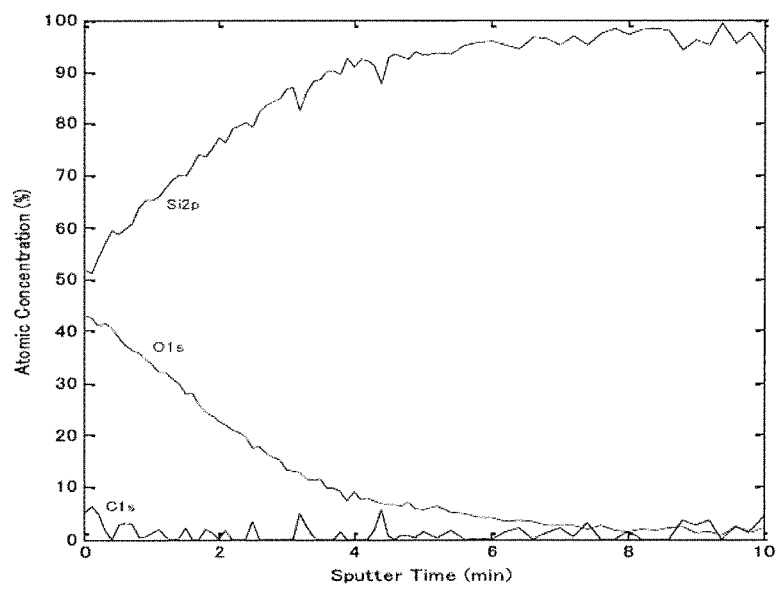
FIG. 5 is a diagram showing the spectral intensity of $Si_{2P}$ and $O_{1S}$, in the depth direction, of the natural oxide film of the Si substrate surface.

From the perspective of adhesion with the Nd base film, preferably the oxide film formed on the Si substrate is a thermal oxide film in the rare earth thin film magnet of the embodiment of the present invention. When a natural oxide film is used, there are cases where film separation occurs at the interface of Si and the rare earth thin film. Meanwhile, when a thermal oxide film is used, based on the test result that the Si substrate itself will break, it is considered that the Nd base layer adheres more favorably to a thermal oxide film in comparison to a natural oxide film. Moreover, a thermal oxide film is preferable in that its film thickness can be controlled more easily in comparison to a natural oxide film. Note that the thickness of a thermal oxide film is 380 to 600 nm, preferably 500 to 550 nm. This is differentiated from the thickness of a natural oxide film on a general Si substrate which is several nm (for instance, roughly 1 to 3 nm). By way of reference, FIG. 5 shows the XPS spectrum of a natural oxide film in the depth direction.

The rare earth thin film magnet of the embodiment of the present invention exhibits superior magnetic properties, and in particular is able to achieve residual magnetization of 0.55 T or more, coercive force of 210 kA/m or more, and maximum energy product $(BH)_{max}$ of 36 kJ/m³ or more. The embodiment of the present invention is superior with respect to the point that it can maintain the foregoing favorable magnetic properties without any separation of the film from the substrate even when a thick film is produced.

The rare earth thin film magnet of the embodiment of the present invention can be produced, for example, as follows. Foremost, a Si substrate with a thermal oxide film formed thereon is prepared. Next, the Si substrate is placed in a pulsed laser deposition device, and then a Nd target and a $Nd_2Fe_{14}B_1$ target are mounted so as to face the Si substrate. Next, the chamber is evacuated so that the degree of vacuum becomes $(2$ to $8) \times 10^{-5}$ Pa, and the Nd target is foremost irradiated with a laser through a condenser lens to form a Nd base film.

As the laser, a Nd:YAG laser (oscillation wavelength: 355 nm, repetition frequency: 30 Hz) may be used. Here, the laser intensity density is preferably 0.1 to 100 J/cm². When the laser intensity density is less than 0.1 J/cm², numerous droplets are generated when the target is irradiated with a laser which may result in the deterioration of the density, and this may consequently deteriorate the magnetic properties. Meanwhile, when the laser intensity density exceeds 100 J/cm², the etching of the target based on laser irradiation becomes excessive, and an undesirable phenomenon where ablation is discontinued may occur.

Next, the Nd target is switched to the $Nd_2Fe_{14}B_1$ target in a vacuum, and a Nd—Fe—B film is deposited. Here, the laser intensity density is preferably 0.1 to 100 J/cm² as with the Nd target described above. When the laser intensity density is less than 0.1 J/cm², numerous droplets are generated when the target is irradiated with a laser which may result in the deterioration of the density, and when the laser intensity density exceeds 100 J/cm², an undesirable phenomenon where ablation is discontinued may occur.

The target surface irradiated with a laser as described above will undergo chemical reaction and melting reaction, and a plasma referred to as a plume is generated. As a result of this plume reaching the opposing substrate, it is possible to form a Nd—Fe—B thin film (amorphous film) on the substrate. Next, the Nd—Fe—B amorphous film deposited in the manner described above is subject to pulsed heat treatment after deposition under the following conditions; namely, a rated output of approximately 8 kW, and a maximum output holding time of roughly 3 seconds, in order to crystallize the Nd—Fe—B amorphous phase.

Here, when heat treatment is not sufficiently performed, the crystallization of the Nd—Fe—B amorphous phase in the film will be insufficient, which causes numerous amorphous phases to remain. Meanwhile, excessive heat treatment may coarsen the $Nd_2Fe_{14}B_1$ crystal grains, and deteriorate the magnetic properties. Accordingly, the pulsed heat treatment is preferably performed within the foregoing range. Incidentally, pulsed heat treatment can promote the instant crystallization of the sample and realize the refinement of the crystal grains by irradiating infrared rays for an extremely short time.

In a case when a Nd—Fe—B film is directly formed on a Si substrate in which a thermal oxide film has been formed thereon, film separation will not occur due to the strain caused by the linear expansion coefficient difference between the film and the substrate during the subsequent heat treatment, but the substrate breakage will occur.

In the numerous tests that were conducted, it has been confirmed that substrate breakage occurs during the cooling process after the heat treatment, and the stress during contraction is considered to be one factor. Meanwhile, it is considered that stress is also generated due to the linear expansion coefficient difference that occurs during a temperature rise, however, crystallization based on heat treatment is hardly affected by the stress for causing the sample to become contracted since the sample is of an amorphous structure immediately after being deposited. Thus it is considered that the influence of the force generated when the crystalized sample subsequently becomes contracted will be greater. In other words, it is considered that the influence of stress generated during a temperature fall will be greater in comparison to the influence of stress generated during a temperature rise.

Subsequently, by performing pulsed magnetization to the crystallized thin film at, for example, a magnetic field of 7 T, it is possible to prepare a rare earth thin film magnet. Note that there is no particular limitation regarding the magnetization method in the embodiment of the present invention, and publicly known magnetization methods may be used. It is thereby possible to produce a Nd—Fe—B rare earth thin film magnet. Not only does this rare earth thin film magnet exhibit superior magnetic properties, it is also effective for preparing micro actuators of micro magnetic devices for MEMS because it is directly deposited on a versatile Si substrate.

EXAMPLES

The embodiment of the present invention is now explained with reference to the Examples and Comparative Examples. Note that these Examples are merely illustrative, and the embodiment of the present invention shall in no way be limited thereby. In other words, various modifications and other embodiments are covered by the embodiment of the present invention, and the embodiment of the present invention is limited only by the scope of its claims.

Example 1

Figure 2:
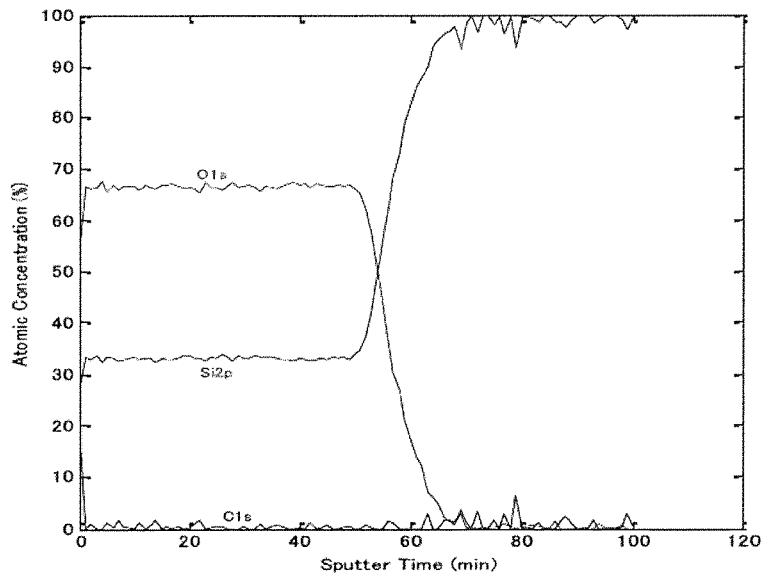
FIG. 2 is a diagram showing the spectral intensity of $Si_{2p}$ and $O_{1S}$, in the depth direction, of the thermal oxide film of the Si substrate surface of Examples 1 to 9 and Comparative Examples 1 to 4.

A $Nd_{2.0}Fe_{14}B$ target having a purity or 99.9% and a relative density of 99% and a Nd target having a purity of 99.9% and a relative density of 99% were prepared, and a 5 mm×5 mm monocrystal Si (100) having a thickness of 622 μm and in which its surface was subject to thermal oxidation treatment was used as a substrate. Here, a thermal oxide film was formed by heating the Si substrate in an oxygen atmosphere at a temperature of 800° C. The thickness of the oxide film was measured by using the device of PHI5000 Versa Probe II manufactured by Ulvac-Phi, Inc. and performing sputtering from the surface based on the following conditions; specifically, ion species of $Ar_+$, acceleration voltage of 3 kV, and a sputter rate of 9.5 nm/minute in terms of $SiO_2$ conversion, and analyzing the peak intensity of the respective spectrums of $Si_{2P}$ and $O_{1S}$ in the depth direction. The results are shown in FIG. 2. Based on FIG. 2, the film thickness of the thermal oxide film was determined to be approximately 515 nm.

Subsequently, the foregoing target and substrate were mounted at their predetermined positions in a pulsed laser deposition device, the chamber was thereafter evacuated to achieve a vacuum, and, after confirming that the degree of vacuum has reached $10^{-5}$ Pa, the target being rotated at approximately 11 rpm was irradiated with a Nd: YAG laser (oscillation wavelength: 355 nm) having a repetition frequency of frequency 30 Hz, and the target substance was ablated and a film was deposited on the substrate. Here, the distance between the target and the substrate was set to 10 mm, and the laser intensity density on the target surface was set to roughly 4 $J/cm^2$. Consequently, a Nd film was deposited in a film thickness of 0.21 μm on the Si substrate, in which a thermal oxide film has been formed thereon, and a Nd—Fe—B amorphous film of Nd/(Nd+Fe)=0.120, in terms of atomic ratio, was continuously deposited in a film thickness of 18.6 μm.

Next, pulsed heat treatment was performed at a rated output of 8 kW and a maximum output holding time of approximately 3 seconds to crystallize the Nd—Fe—B-based amorphous phase. Subsequently, pulsed magnetization was performed at a magnetic field of 7 T to prepare a rare earth thin film magnet. In order to check the separation characteristics of the Nd—Fe—B film, a 5 mm×5 mm sample was subject to cutting work via dicing in order to split the sample into quarters each having a size of 2.5 mm×2.5 mm, and it was confirmed that the samples could be processed without any mechanical damage. Next, the magnetic properties of the diced samples were measured using a VSM (Vibrating Sample Magnetometer). As shown in Table 1, the results were as follows; specifically, residual magnetization was 1.18 T, coercive force was 260 kA/m, and (BH)max was 76 $kJ/m^3$, and favorable magnetic properties were obtained. Furthermore, a micrometer was used to evaluate the film thickness, and EDX (Energy Dispersive X-ray spectroscopy) was used to analyze the composition of the film. The results are shown in Table 1.

Examples 2 to 10

In Examples 2 to 10, based on the same conditions as Example 1, a Nd base film was formed on a Si substrate, in which a thermal oxide film has been formed thereon, a Nd—Fe—B film having a composition (atomic ratio) which satisfies a conditional expression of 0.120≤Nd/(Nd+Fe)<0.150 was subsequently deposited thereon, and pulsed heat treatment was thereafter performed to obtain a crystallized film. Here, the film thickness of the Nd base film and the film thickness of the Nd—Fe—B film were respectively changed in the Examples.

Next, each of the thin films was subject to pulsed magnetization to prepare a rare earth thin film magnet. The film separation and magnetic properties of the obtained rare earth thin film magnets were checked in the same manner as Example 1. The results are shown in Table 1. As shown in Table 1, all Examples 2 to 10 exhibited favorable magnetic properties without any film separation or substrate breakage.

Figure 3:
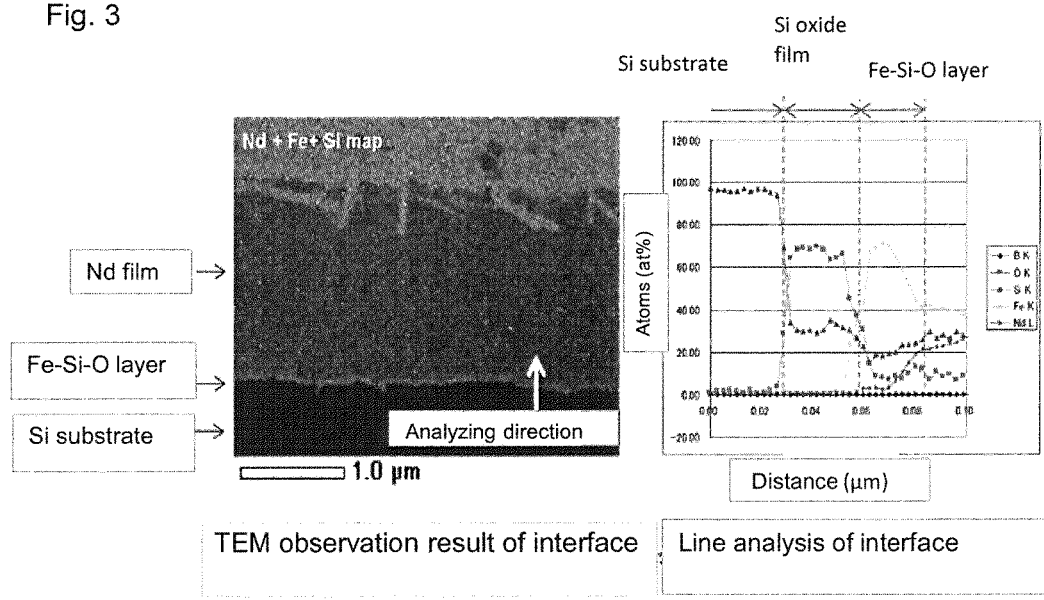
FIG. 3 is a diagram showing a TEM observation photograph of the interface of the rare earth thin film magnet of Example 8.
Figure 4:
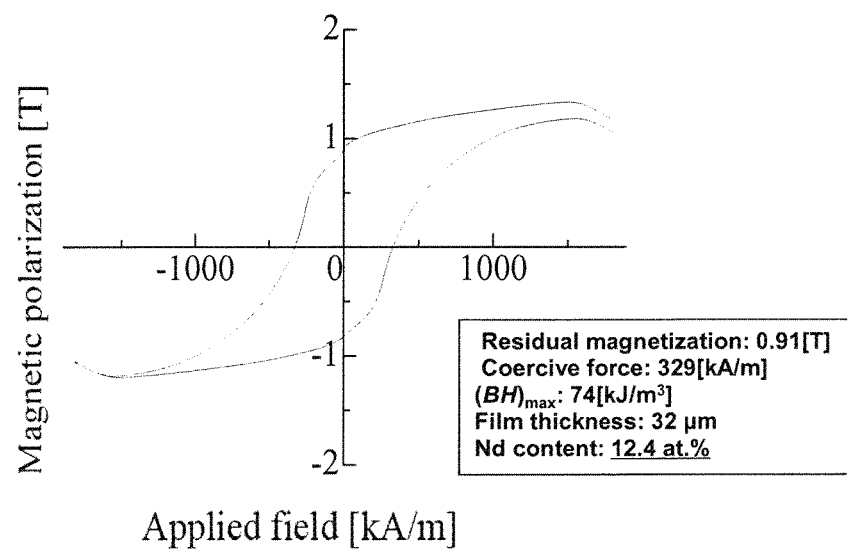
FIG. 4 is a diagram showing the magnetic properties of the rare earth thin film magnet of Example 8.

By way of reference, a TEM photograph of the interface of the rare earth thin film magnet of Example 8 is shown in FIG. 3, and the B—H properties are shown in FIG. 4. As shown in FIG. 3, an Fe—Si—O layer is formed between the Si substrate and the Nd base film (near the interface of the Si substrate and the thermal oxide film, in the thermal oxide film, and near the interface of the thermal oxide film and the Nd base film). This is considered to be a result of the diffusion of Fe from the Nd—Fe—B film to the Si substrate via the Nd base film caused by the pulsed heat treatment, and a factor which is contributing to the improvement in adhesion between the Si substrate and the laminated film.

Comparative Example 1

In Comparative Example 1, based on the same conditions as Example 1, but a Nd base film was not formed on a Si substrate, in which a thermal oxide film has been formed thereon, a Nd—Fe—B film having a thickness of 18.2 μm and an atomic ratio of Nd/(Nd+Fe)=0.125 was deposited on the Si substrate, and pulsed heat treatment was thereafter performed to obtain a crystallized film. Next, this thin film was subject to pulsed magnetization to prepare a rare earth thin film magnet. With the thus obtained rare earth thin film magnet, a 5 mm×5 mm sample was subject to cutting work via dicing in order to split the sample into quarters each having a size of 2.5 mm×2.5 mm in the same manner as Example 1, but film separation occurred, and it was not possible to check the magnetic properties.

Comparative Example 2

In Comparative Example 2, based on the same conditions as Example 1, a Nd base film having a film thickness of 0.5

μm was formed on a Si substrate, in which a thermal oxide film has been formed thereon, a Nd-poor Nd—Fe—B film having a thickness of 13.5 μm and an atomic ratio of Nd/(Nd+Fe)=0.118, in which the Nd composition is deficient in comparison to the stoichiometric composition, was subsequently deposited on the Si substrate, and pulsed heat treatment was thereafter performed to obtain a crystallized film. Next, this thin film was subject to pulsed magnetization to prepare a rare earth thin film magnet. The magnetic properties of the thus obtained rare earth thin film magnet were checked in the same manner as Example 1. As a result, the coercive force, residual magnetization, and $(BH)_{max}$ were respectively 210 kA/m, 0.10 T, and 15 kJ/m$^3$, and it was confirmed that the magnetic properties had deteriorated considerably. While a 5 mm×5 mm sample was subject to cutting work via dicing in order to split the sample into quarters each having a size of 2.5 mm×2.5 mm, film separation and substrate breakage were not observed.

Comparative Example 3

In Comparative Example 3, based on the same conditions as Example 1, a Nd base film having a film thickness of 5.1 μm was formed on a Si substrate, in which a thermal oxide film has been formed thereon, a Nd—Fe—B film having a thickness of 13.2 μm and an atomic ratio of Nd/(Nd+Fe)=0.123 was subsequently deposited on the Si substrate, and pulsed heat treatment was thereafter performed to obtain a crystallized film. Next, this thin film was subject to pulsed magnetization to prepare a rare earth thin film magnet. With the thus obtained rare earth thin film magnet, a 5 mm×5 mm sample was subject to cutting work via dicing in order to split the sample into quarters each having a size of 2.5 mm×2.5 mm in the same manner as Example 1, but film separation partially occurred, and it was not possible to check the magnetic properties.

Note that, when the Nd base film is deposited as a thick film as with Comparative Example 3, the occurrence of partial film separation is considered to be a result of the diffusion of Fe from the Nd—Fe—B film to the Si substrate caused by the pulsed heat treatment becoming insufficient, and an adhesion layer formed from Fe—Si—O not being sufficiently formed between the Si substrate and the Nd base film.

Comparative Example 4

In Comparative Example 4, based on the same conditions as Example 1, a Nd base film having a film thickness of 1.1 μm was formed on a Si substrate, in which a thermal oxide film has been formed thereon, a Nd—Fe—B film having a thickness of 52.0 μm and an atomic ratio of Nd/(Nd+Fe)=0.135 was subsequently deposited on the Si substrate, and pulsed heat treatment was thereafter performed to obtain a crystallized film. Next, this thin film was subject to pulsed magnetization to prepare a rare earth thin film magnet. With the thus obtained rare earth thin film magnet, a 5 mm×5 mm sample was subject to cutting work via dicing in order to split the sample into quarters each having a size of 2.5 mm×2.5 mm in the same manner as Example 1, but film separation partially occurred, and it was not possible to check the magnetic properties.

Note that, when the film thickness of the Nd—Fe—B film is thick at 50 μm or more as with Comparative Example 4, even when a Nd base film is provided, because the ratio of thickness of the Nd—Fe—B film relative to the thickness of the adhesion layer formed from Fe—Si—O becomes excessive, it is considered that film separation and substrate breakage could not be fully inhibited in terms of mechanical strength.

TABLE 1

| | Nd film thickness (μm) | NdFeB film Nd composition (at %) | NdFeB film Film thickness (μm) | Residual magnetization (T) | Maximum magnetization (T) | Coercivity (kA/m) | (BH)max (kJ/m3) | Film adhesion |
|---|---|---|---|---|---|---|---|---|
| Example 1 | 3.00 | 12.0 | 18.6 | 1.18 | 1.79 | 260 | 76 | No film separation, No substrate breakage |
| Example 2 | 0.23 | 14.6 | 9.5 | 0.57 | 0.80 | 419 | 36 | No film separation, No substrate breakage |
| Example 3 | 3.10 | 12.1 | 28.1 | 1.24 | 1.86 | 238 | 89 | No film separation, No substrate breakage |
| Example 4 | 3.30 | 12.7 | 16.5 | 0.64 | 0.96 | 320 | 37 | No film separation, No substrate breakage |
| Example 6 | 1.20 | 13.5 | 15.6 | 0.65 | 0.90 | 512 | 55 | No film separation, No substrate breakage |
| Example 7 | 1.20 | 12.0 | 37.8 | 0.77 | 1.01 | 433 | 57 | No film separation, No substrate breakage |
| Example 8 | 1.20 | 12.4 | 32.2 | 0.91 | 1.21 | 329 | 74 | No film separation, No substrate breakage |
| Example 9 | 4.80 | 12.0 | 38.0 | 1.08 | 1.80 | 214 | 58 | No film separation, No substrate breakage |
| Example 10 | 1.00 | 13.4 | 50.0 | 0.66 | 0.92 | 530 | 56 | No film separation, No substrate breakage |
| Comparative Example 1 | 0.00 | 12.5 | 18.2 | — | — | — | — | Flm separation, Substrate breakage |
| Comparative Example 2 | 0.50 | 11.8 | 13.5 | 0.10 | 0.35 | 210 | 15 | No film separation, No substrate breakage |
| Comparative Example 3 | 5.10 | 12.3 | 13.2 | — | — | — | — | Film separation |
| Comparative Example 4 | 1.10 | 13.5 | 52.0 | — | — | — | — | Flm separation, Substrate breakage |

A Nd—Fe—B rare earth thin film magnet of the embodiment of the present invention exhibits favorable magnetic properties and is free from film separation and substrate breakage, which is configured by a Nd base film on a Si substrate having an oxidized surface, depositing a Nd—Fe—B film having a composition (atomic ratio) which satisfies $0.120 \leq Nd/(Nd+Fe) < 0.150$ on the Nd base film. The Nd—Fe—B rare earth thin film magnet of the embodiment of the present invention is effective for use as a magnetic device to be applied in the energy sector such as energy burst (energy harvesting) as well as in the field of medical appliances. The rare earth thin film magnet is particularly effective for use in preparing micro actuators of micro magnetic devices for MEMS.

The invention claimed is:

1. A rare earth thin film magnet having Nd, Fe and B as essential components comprising: a Nd base film, as a first layer, formed on a Si substrate having an oxide film on a surface thereof; and a Nd—Fe—B film as a second layer on the first layer; a composition (atomic ratio) of Nd—Fe—B of the second layer satisfies a conditional expression of $0.120 \leq Nd/(Nd+Fe) < 0.150$; and a film thickness of the second layer is 5 µm or more and 50 µm or less and a film thickness of the first layer is 0.2 µm or more and 5.0 µm or less.

2. The rare earth thin film magnet according to claim 1, wherein the oxide film is a thermal oxide film.

3. The rare earth thin film magnet according to claim 2, wherein the rare earth thin film magnet comprises a layer formed from Fe—Si—O between the Si substrate and the Nd base film.

4. The rare earth thin film magnet according to claim 3, wherein the rare earth thin film magnet has a residual magnetization of 0.55 T or more.

5. The rare earth thin film magnet according to claim 4, wherein the rare earth thin film magnet has a coercive force of 210 kA/m or more.

6. The rare earth thin film magnet according to claim 5, wherein the rare earth thin film magnet has a maximum energy product $(BH)_{max}$ of 36 kJ/m³ or more.

7. A method of producing a rare earth thin film magnet, wherein an oxide film is formed on a Si substrate, a Nd base film as a first layer is formed on the Si substrate via laser pulsed deposition, a Nd—Fe—B film as a second layer is subsequently formed thereon, and heat treatment is thereafter performed thereto to produce a rare earth thin film magnet having Nd, Fe and B as essential components comprising a Nd base film, as a first layer, formed on a Si substrate having an oxide film on a surface thereof, and a Nd—Fe—B film as a second layer on the first layer, a composition (atomic ratio) of Nd—Fe—B of the second layer satisfies a conditional expression of $0.120 \leq Nd/(Nd+Fe) < 0.150$, and a film thickness of the second layer is 5 µm or more and 50 µm or less and a film thickness of the first layer is 0.2 µm or more and 5.0 µm or less.

8. The method of producing a rare earth thin film magnet according to claim 7, wherein the heat treatment is performed at a temperature of 500° C. or higher and 800° C. or less.

9. The rare earth thin film magnet according to claim 1, wherein the rare earth thin film magnet comprises a layer formed from Fe—Si—O between the Si substrate and the Nd base film.

10. The rare earth thin film magnet according to claim 1, wherein the rare earth thin film magnet has a residual magnetization of 0.55 T or more.

11. The rare earth thin film magnet according to claim 1, wherein the rare earth thin film magnet has a coercive force of 210 kA/m or more.

12. The rare earth thin film magnet according to claim 1, wherein the rare earth thin film magnet has a maximum energy product $(BH)_{max}$ of 36 kJ/m³ or more.

* * * * *